(12) United States Patent
Guo

(10) Patent No.: US 11,181,813 B2
(45) Date of Patent: Nov. 23, 2021

(54) PROJECTOR LIGHT VALVE MODULE WITH LIQUID LENS

(71) Applicant: NANHUA INTELLIGENT PRECISION MACHINE (SHENZHEN) CO., LTD., Guangdong (CN)

(72) Inventor: Hanwen Guo, Jiangsu (CN)

(73) Assignee: NANHUA INTELLIGENT PRECISION MACHINE (SHENZHEN) CO., LTD., Guangdong (CN)

( * ) Notice: Subject to any disclaimer, the term of this patent is extended or adjusted under 35 U.S.C. 154(b) by 0 days.

(21) Appl. No.: 16/985,227

(22) Filed: Aug. 5, 2020

(65) Prior Publication Data

US 2020/0363708 A1   Nov. 19, 2020

(30) Foreign Application Priority Data

Mar. 1, 2020   (CN) .......................... 202010134533.4

(51) Int. Cl.

| | |
|---|---|
| *G03B 21/16* | (2006.01) |
| *G02B 3/12* | (2006.01) |
| *G02B 7/02* | (2021.01) |
| *G02F 1/1333* | (2006.01) |
| *G03B 21/00* | (2006.01) |
| *G03B 21/20* | (2006.01) |
| *H05K 7/20* | (2006.01) |

(52) U.S. Cl.
CPC ............... *G03B 21/16* (2013.01); *G02B 3/12* (2013.01); *G02B 7/021* (2013.01); *G02F 1/133308* (2013.01); *G02F 1/133385* (2013.01); *G03B 21/006* (2013.01); *G03B 21/208* (2013.01); *G03B 21/2073* (2013.01); *H05K 7/2039* (2013.01); *H05K 7/20272* (2013.01)

(58) Field of Classification Search
CPC ...... G03B 21/16; G03B 21/12; G03B 21/006; G03B 21/2073; G03B 21/208; G02F 1/133308; G02F 1/133385
USPC .......................................................... 353/54
See application file for complete search history.

(56) References Cited

U.S. PATENT DOCUMENTS

| | | | | |
|---|---|---|---|---|
| 5,170,195 | A * | 12/1992 | Akiyama | .......... G02F 1/133385 349/161 |
| 6,280,035 | B1 * | 8/2001 | Tadic-Galeb | .......... G02B 13/22 353/31 |
| 2008/0252801 | A1 * | 10/2008 | Furuta | .................. H04N 9/3105 349/9 |

* cited by examiner

*Primary Examiner* — Jerry L Brooks

(57) ABSTRACT

A projector light valve module with a liquid lens includes: a structural support, an LCD light valve, and an incident lens, wherein the incident lens is connected to a first end of the structural support; a first cavity is sealed and is formed by the incident lens, the structural support and the LCD light valve, and the first cavity is filled with transparent cooling liquid; similarly, the emergent lens is connected to a second end of the structural support, to form a second cavity and a second liquid lens. The present invention combines heat dissipation and optics, and provides more efficient lighting and better imaging quality through optical and heat dissipation effects of the first and second liquid lenses, thereby achieving better heat dissipation, and better user experience and satisfaction.

10 Claims, 11 Drawing Sheets

PROJECTOR LIGHT VALVE MODULE WITH LIQUID LENS

CROSS REFERENCE OF RELATED APPLICATION

The present invention claims priority under 35 U.S.C. 119(a-d) to CN 202010134533.4, filed Mar. 1, 2020.

BACKGROUND OF THE PRESENT INVENTION

Field of Invention

The present invention relates to a technical field of LCD projectors, and more particularly to a projector light valve module with a liquid lens.

Description of Related Arts

The incident side of the LCD projector light valve is always provided with an incident lens to collimate or focus the illumination light. Considering the actual projector lens aperture, depth of field, illumination aperture, and other indicators, the distance between the incident lens and the light valve cannot be too close nor too far, usually around 8-13 mm. The emergent side of the light valve is usually provided with a field lens, usually around 8-5 mm away from the light valve. The design constraints of the light valve are as follows. The incident lens needs to withstand high light intensity. For high lighting efficiency and uniformity, glass aspheric or free-form lenses can be used, but it is expensive, and film thereon is easy to peel off. Plastic lens has poor durability, especially when the size of the light valve is large, the increased thickness of the center of the plastic lens will easily lead to locally softening and deforming or even burning and melting. The field lens is involved in imaging, and requirements of accuracy and thermal expansion and contraction of the field lens are much higher that those of the incident lens. Therefore, it is not feasible to use aspheric lens to improve the imaging quality of the field lens. The narrow and long cooling air duct between the light valve and the incident lens severely lowers the air-cooling system efficiency, and cannot prevent dust from affecting lighting and imaging on both sides of the light valve. Furthermore, the accumulation of dust will accelerate the aging of raw materials. Temperature difference between air inlet side and air outlet side of the light valve can reduce the image brightness and color uniformity. Both the incident lens and the field lens are very close to the light valve, which provide direct impact on heat dissipation and imaging quality.

In view of the above reasons, it is necessary to design a projector that can not only complete the optical function of the above-mentioned lens, but also improve the lighting efficiency and imaging quality as well as heat dissipation problem of the light valve.

SUMMARY OF THE PRESENT INVENTION

In order to solve the above design constraints, the present invention aims to an object of the present invention is to provide a projector light valve module with a liquid lens to solve the technical problem.

Accordingly, the present invention provides a projector light valve module with a liquid lens, comprising: a structural support, an LCD (liquid-crystal display) light valve, and an incident lens, wherein the structural support has a containing channel; the LCD light valve is assembled in the containing channel; the incident lens is connected to a first end of the structural support, to cover an opening at a first end of the containing channel, wherein a first cavity is sealed and is formed by the incident lens, the structural support and the LCD light valve, and the first cavity is filled with transparent cooling liquid; a first liquid lens is formed by an emergent surface of the incident lens, the transparent cooling liquid in the first cavity, and an incident surface of the LCD light valve; wherein, when light from a projector illumination system passes through the incident lens, the first liquid lens, and the LCD light valve in sequence, the incident lens and the first liquid lens are integrated without air gap to refract and shape the light, and the first liquid lens cools the LCD light valve and the incident lens.

Preferably, the projector light valve module further comprises: an emergent lens, wherein the emergent lens is connected to a second end of the structural support, to cover an opening at a second end of the containing channel; a second cavity is sealed and is formed by the LCD light valve, the emergent lens and the structural support, and the second cavity is filled with transparent cooling liquid; a second liquid lens is formed by an emergent surface of the LCD light valve, the transparent cooling liquid in the second cavity, and an incident surface of the emergent lens; the second liquid lens and the emergent lens are integrated without air gap to provide a field lens function; wherein, when the light from the projector illumination system passes through the incident lens, the first liquid lens, the LCD light valve, the second liquid lens, and the emergent lens in sequence, the first liquid lens and the second liquid lens are involved in refracting and shaping the light, and meanwhile cool the LCD light valve, the incident lens and the emergent lens.

Preferably, the projector light valve module further comprises: an incident polarizing plate assembled in the first cavity, wherein the incident polarizing plate comprises two first glass substrates which are opposed and sealed, a reflective polarizer, and a first absorption polarizer; the reflective polarizer and the first absorption polarizer are arranged between the two first glass substrates; an incident surface of the reflective polarizer faces the incident lens.

Preferably, the projector light valve module further comprises: an emergent polarizing plate assembled in the second cavity, wherein the emergent polarizing plate comprises two second glass substrates which are opposed and sealed, and a second absorption polarizer; the second absorption polarizer is arranged between the two second glass substrates.

Preferably, the projector light valve module further comprises: a first pressing piece, which presses and fixes the incident polarizing plate to stabilize the incident polarizing plate; and/or a second pressing piece, which presses and fixes the emergent polarizing plate to stabilize the emergent polarizing plate.

Preferably, the projector light valve module further comprises: a third pressing piece, which presses and fixes the incident lens to stabilize the incident lens; and/or a fourth pressing piece, which presses and fixes the emergent lens to stabilize the emergent lens; and/or a fifth pressing piece, which presses and fixes the LCD light valve to stabilize the LCD light valve.

Preferably, a plurality of fins are provided on a peripheral wall of the structural support; wherein after the structural support absorbs heat of the first liquid lens and the second liquid lens, the heat is further diffused into air by the fins; the structural support is made of a thermally conductive material.

Preferably, the projector light valve module further comprises: a thermal diffusion device connected to a peripheral wall of the structural support, wherein the thermal diffusion device comprises a profile heat sink, a pipe heat sink, and a thermally conductive diffusion sheet; wherein heat of the first liquid lens and the second liquid lens sequentially passes through the structure support and the thermal diffusion device, and is diffused into air; the structural support is made of a thermally conductive material.

Preferably, the projector light valve module further comprises: an external piping system and a circulation pump, wherein the external piping system passes through the structural support and is connected to the first cavity and the second cavity; the external piping system is connected to the circulation pump; wherein the transparent cooling liquid in the first cavity and the second cavity is drawn out by the circulation pump through the external piping system, which then passes through the external piping system and flows back into the first cavity and the second cavity, so as to increase a convection speed of the transparent cooling liquid in the first cavity and the second cavity.

Preferably, the projector light valve module further comprises: a radiator cooling system or a semiconductor refrigeration system, wherein the external piping system is connected to the radiator cooling system or the semiconductor refrigeration system; wherein the circulation pump draws the transparent cooling liquid in the first cavity and the second cavity into the radiator cooling system or the semiconductor refrigeration system, and then draws cooled transparent cooling liquid in the water tank heat dissipation system or the semiconductor refrigeration system into the first cavity and the second cavity.

Beneficial Effects of the Present Invention

The present invention combines heat dissipation and optics. By injecting the transparent cooling liquid between the incident lens and the emergent lens, the liquid lens made of liquid is formed to participate refraction and shaping of the light. As a result, materials of the incident lens and the emergent lens can be thinner, especially center thickness can be significantly reduced, and the material thickness can be more evenly and continuously distributed, which will have an essential improvement in molding accuracy and thermal stability of large-diameter injection free-form surfaces and aspheric lenses. A free-form surface liquid lens on the incident side (the first liquid lens) improves illumination efficiency and uniformity, while the aspheric liquid lens on the emergent side (the second liquid lens) improves the aberration of the projection lens, widens the lens, and reduces the number of apertures. With the liquid lens, multilayer air gaps at optical parts, which the original light pass through before and after the LCD light valve, are filled with transparent cooling liquid, so the multilayer air gaps of the original transmission process no longer exist, leading to more efficient lighting and less stray light, improved image quality, and no adverse effects caused by dust accumulated on the light value during air cooling. By simplifying a seal structure, components involved in sealing are mechanically locked and local stress is dispersed, so as to reduce the possibility of liquid leakage, and increase the practical feasibility of liquid lens. In addition, the liquid lens realizes efficient heat dissipation and temperature equalization of the LCD light valve, as well as of the incident lens and the emergent lens beside the LCD light valve, thereby providing a longer service life, creating the necessary conditions for outputting higher brightness, significantly improving the image color deviation, significantly reducing heat dissipation noise, and increasing user satisfaction.

BRIEF DESCRIPTION OF DRAWINGS

In order to explain embodiments of the present invention or technical solutions in the prior art more clearly, drawings involved in the embodiments or the prior art will be briefly introduced below. Obviously, the drawings in the following description are only some embodiments of the present invention. For those of ordinary skill in the art, without paying any creative work, other drawings may be obtained based on these drawings.

DETAILED DESCRIPTION OF THE PREFERRED EMBODIMENT

Figure 1:
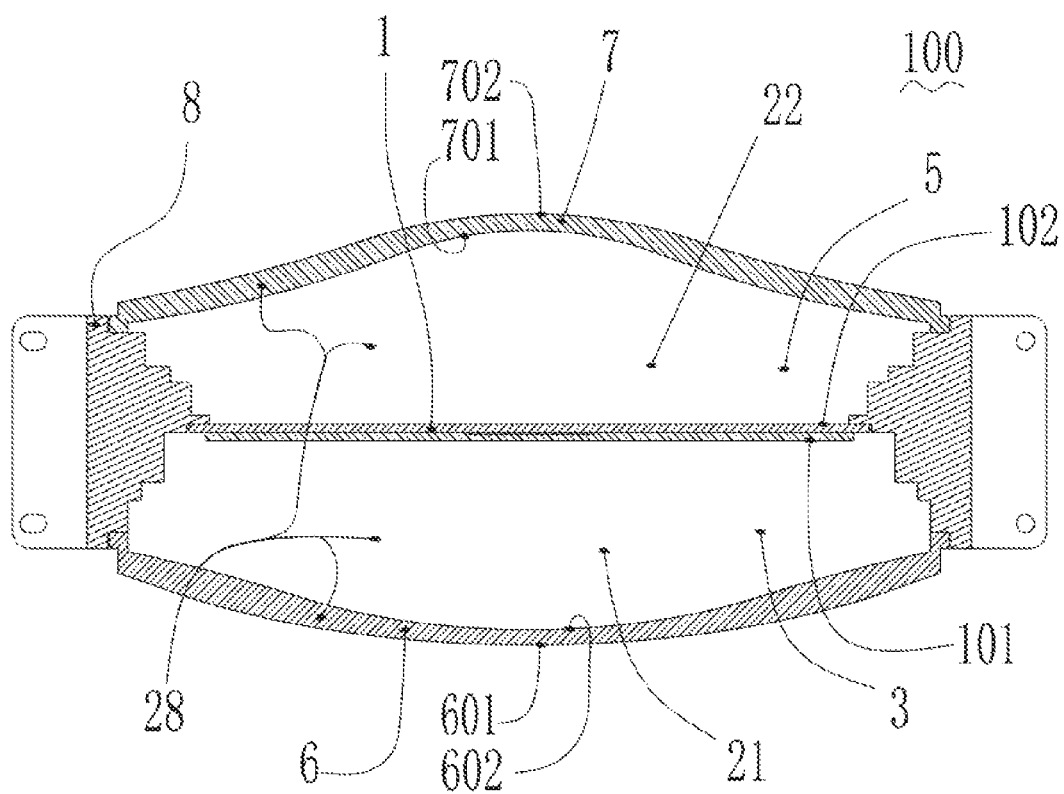
FIG. 1 is a cross-sectional view of a projector light valve module provided by the present invention.

It should be noted that the terms "center", "upper", "lower", "left", "right", "vertical", "horizontal", "inner", "outer", etc. indicate the orientation or positional relationship as based on those shown in the drawings, or those when the present invention is commonly used. Such terms are only for describing the present invention and simplifying the description, and do not indicate or imply the device or element must have a specific orientation, or be constructed and operated in a specific orientation. Therefore, such terms cannot be understood as a limitation of the present invention. In addition, the terms "first", "second", "third", etc. are only used to distinguish the elements, and cannot be understood as indicating or implying relative importance.

In the description of the present invention, it should also be noted that, unless being otherwise specified and limited, the terms "setup", "installation", "connect", and "connection" should be understood in a broad sense. For example, connection can be fixed, detachable, or integrated; can be mechanical or electrical; can be direct or indirect through an intermediate medium; and can be internal between two components. For those of ordinary skill in the art, the specific meanings of the above terms in the present invention can be understood in specific situations.

Referring to FIG. 1, the present invention provides a projector with a liquid lens, comprising: a projector light valve module 100 with the liquid lens, wherein light from the projector illumination system passes through the projector light valve module 100 and is emitted.

The projector light valve module 100 comprises: an LCD light valve 1, an incident lens 6, an emergent lens 7, and a structural support 8, wherein the LCD light valve 1 is assembled in a containing channel; the incident lens 6 is connected to a first end of the structural support 8, to cover an opening at a first end of the containing channel; a first cavity 3 is sealed and is formed by the incident lens 6, the structural support 8 and the LCD light valve 1, and the first cavity 3 is filled with transparent cooling liquid, so as to optically form a first liquid lens 21 made of the transparent cooling liquid. At an incident side of the LCD light valve 1, the incident lens 6 and the first liquid lens 21 are integrated without air gap to illuminate.

Optionally, a second cavity 5 is sealed and is formed by the LCD light valve 1, the emergent lens 7 and the structural support 8, and the second cavity 5 is filled with transparent cooling liquid, so as to optically form a second liquid lens 22. At an emergent side of the LCD light valve 1, the second liquid lens 22 and the emergent lens 7 are integrated without air gap to provide a field lens function.

The present invention combines heat dissipation and optics. The incident lens 6, the first liquid lens 21, the second liquid lens 22, and the emergent lens 7 together form an integral lens 28. Optically, an incident surface of the integral lens 28 is an incident surface 601 of the incident lens 6, and an emergent surface is an emergent surface 702 of the emergent lens 7. The incident surface 601 and emergent surface 702 can be easily coated with antireflection films, and heat dissipation is sufficient, so reflection loss of the projector at each interface before and after the light valve is reduced from multiple surfaces to two surfaces.

In addition, two ends of the structural support 8 are sealed by the incident lens 6 and the emergent lens 7 respectively, thereby simplifying a seal structure. Components involved in sealing are mechanically locked, so as to reduce the possibility of liquid leakage, and increase the practical feasibility of liquid lens. The liquid lens realizes efficient heat dissipation and temperature equalization of the LCD light valve 1, as well as of the incident lens 6 and the emergent lens 7, thereby providing a longer service life, creating the necessary conditions for outputting higher brightness, significantly improving the image color deviation, significantly reducing heat dissipation noise, and increasing user satisfaction.

Refractive indexes of the transparent cooling liquid in the first cavity 3 and/or the second cavity 5 is preferably, but not limited to, 1.4-1.5.

Preferably, the transparent cooling liquid in the first cavity 3 and/or the second cavity 5 has non-corrosiveness, non-decomposition, oxidation resistance, moisture absorption resistance, low volatility, adjustable and stable viscosity, resistance to 420-660 nm strong light irradiation, stable refractive index in a range of 0° C.-50° C., and no phase change in a range of −20° C.-+80° C. The transparent cooling liquid is non-corrosive to optical and electronic glass, aluminum, copper, rubber, polymer, and resin, and insulation performance of the transparent cooling liquid must be better than Chinese national standard requirements for liquid insulation materials.

Referring to FIGS. 2-5, The projector light valve module 100 further comprises an incident polarizing plate 2 assembled in the first cavity 3, wherein the incident polarizing plate 2 comprises two first glass substrates 201, 204 which are opposed and sealed, a reflective polarizer 202, and a first absorption polarizer 203; the reflective polarizer 202 and the first absorption polarizer 203 are arranged between the two first glass substrates 201, 204; an incident surface of the reflective polarizer 202 faces the incident lens 6.

Figure 4:
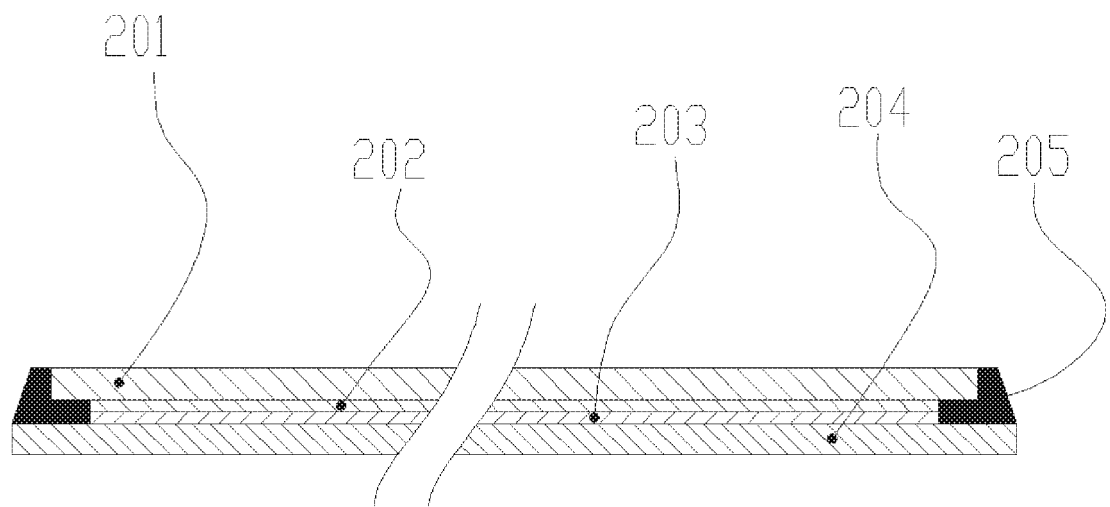
FIG. 4 is a cross-sectional view of an incident polarizing plate according to an embodiment provided by the present invention.

Specifically, referring to FIG. 4, length and width of the first glass substrates 204 are larger than those of the first glass substrates 201, wherein the width is, but not limited to, 2-3 mm. Length and width of the first glass substrates 202 are larger than those of the reflective polarizer 202, wherein the width is, but not limited to, 2-3 mm. Sizes of the reflective polarizer 202 equal to those of the first absorption polarizer 203, but are not limited to so.

When the first glass substrates 201 and 204 are butted, 704 silicone rubber is used for filling and sealing as a structure 205 to avoid the reflective polarizer 202 and the first absorption polarizer 203 from contacting the cooling liquid.

After the reflective polarizer 202, such as a DBEF film of 3M, is overlapped and laminated with the first absorption polarizer 203, they are centrally bonded to the first glass substrate 204, and then covered with the first glass substrate 201.

Optionally, the reflective polarizer 202 and the first absorptive polarizer 203 may also use an integrated APF (advanced polarization film) material to improve production efficiency.

The projector light valve module 100 further comprises: an emergent polarizing plate 4 assembled in the second cavity 5, wherein the emergent polarizing plate 4 comprises two second glass substrates 401, 403 which are opposed and sealed, and a second absorption polarizer 402; the second absorption polarizer 402 is arranged between the two second glass substrates 401, 403.

Figure 5:
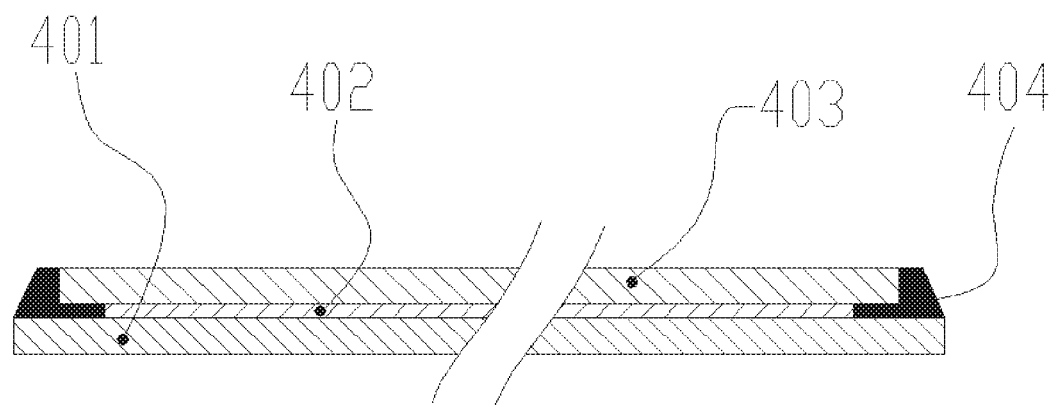
FIG. 5 is a cross-sectional view of an emergent polarizing plate according to an embodiment provided by the present invention.

Specifically, referring to FIG. 5, the second absorbing polarizer 402 is centrally bonded to the second glass substrate 401, and then covered with the second glass substrate 403. Length and width of the second glass substrate 401 are larger than those of the second glass substrate 403 by, but not limited to, 2-3 mm. The length and width of the second glass substrate 403 are larger than those of the second absorption polarizer 402 by, but not limited to, 2-3 mm. The manufacturing method is similar to that of the incident polarizing plate 2. The second glass substrates 401 and 403 are filled and sealed with 704 silicon rubber as a structure 404.

The transparent cooling liquid is preferably a colorless and odorless optical grade liquid such as silicone oil, which has absolutely no effect on the durability of materials such as of glass substrate silicone sealing of the LCD light valve 1, IC (integrated circuit), and bonding of connection cables, and has no effect on electrical performance. When the LCD light valve 1 is an LTPS (low temperature polysilicon) panel, silicone oil is beneficial to prolong service life of the IC, to avoid electrostatic breakdown and high-temperature shedding after a certain amount of dust is adsorbed.

Figure 2:
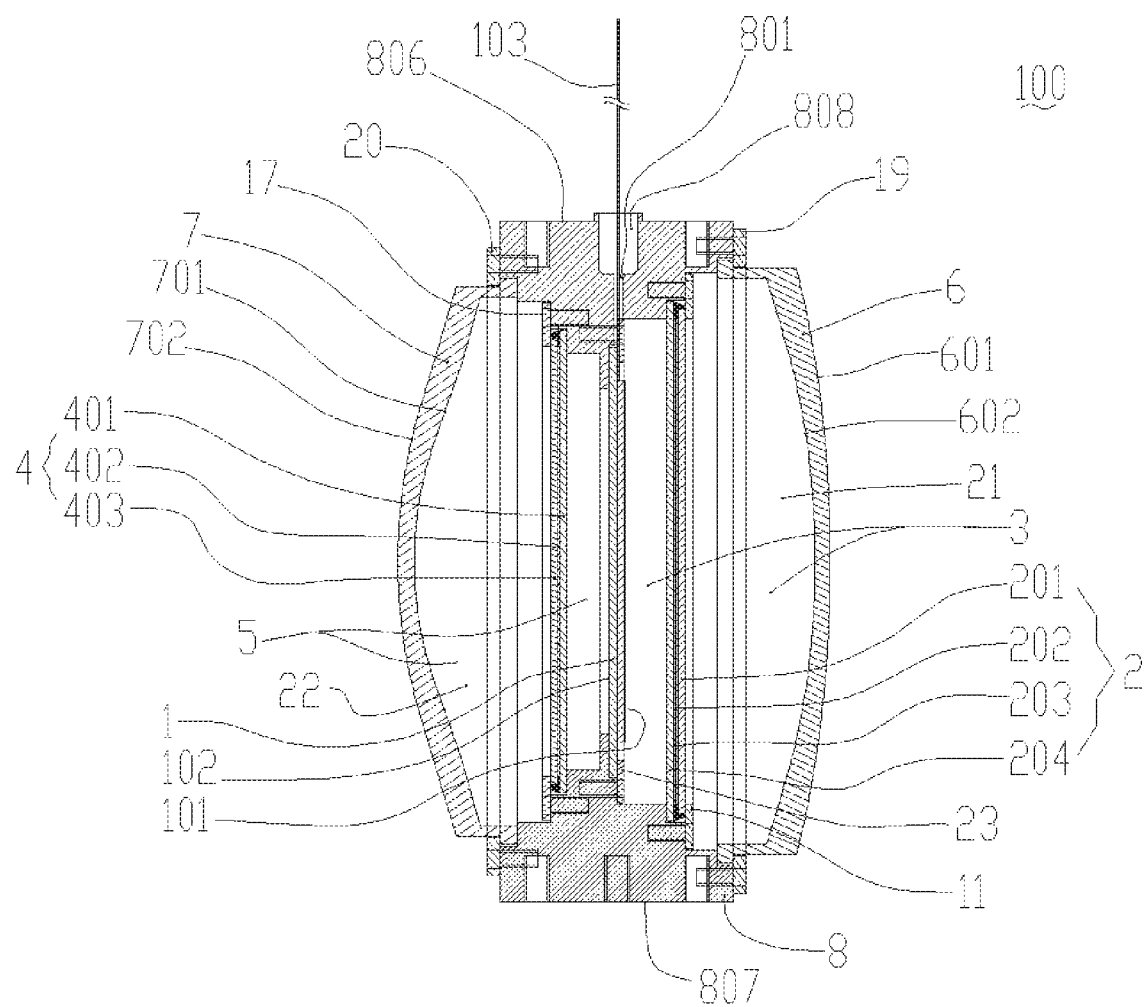
FIG. 2 is a cross-sectional view oft projector light valve module according to another embodiment provided by the present invention.
Figure 3:
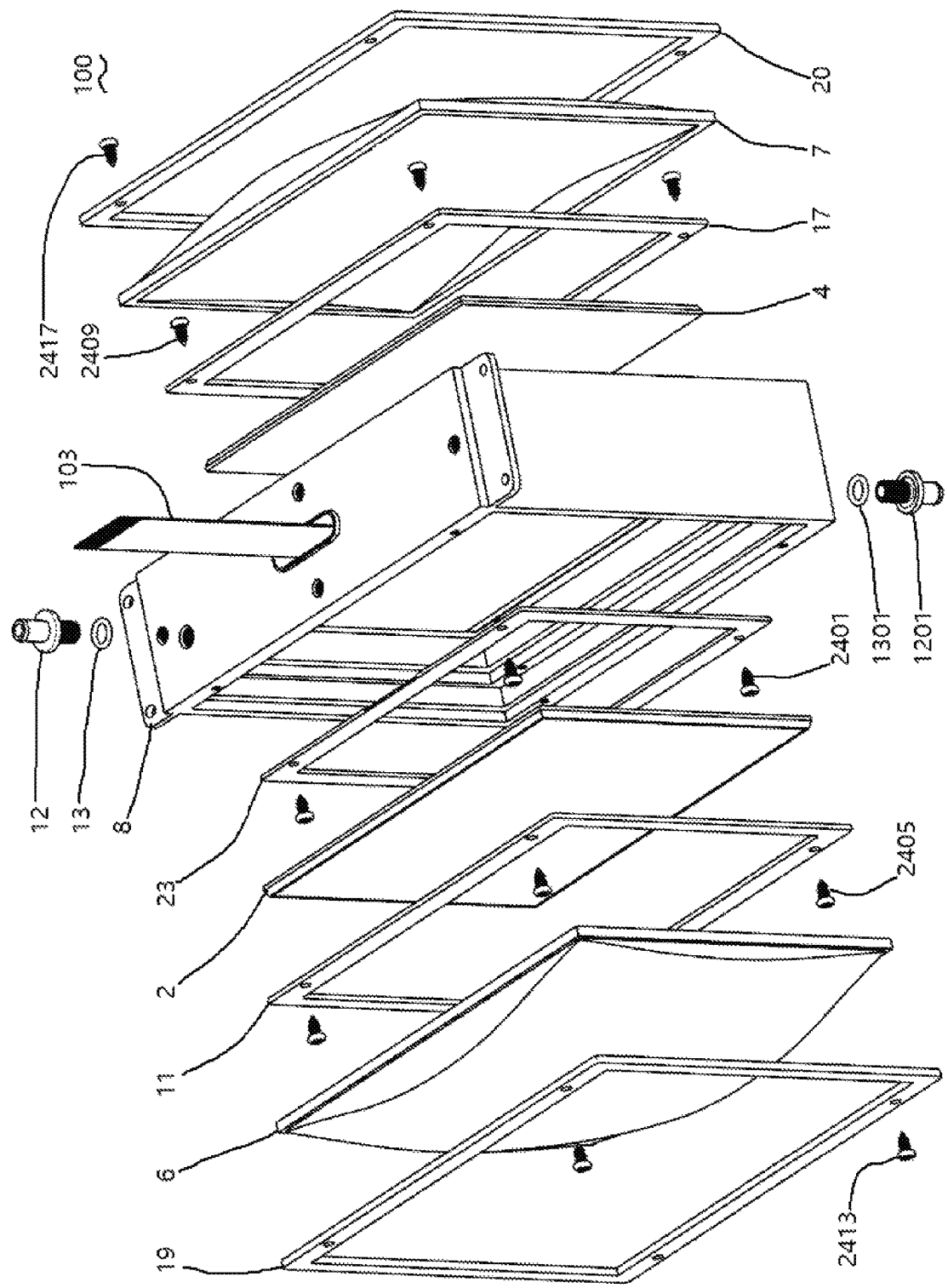
FIG. 3 is an exploded view of the projector light valve module according to another embodiment provided by the present invention.

Referring to FIG. 2, the incident lens 6 of a conventional single LCD projector is a Fresnel lens (referred to as F lens). In pursuit of miniaturization, a distance between a projector light source and the LCD light valve 1 is continuously shortened until the distance is only 50%-90% diagonal length of the LCD light valve 1. As a result, a focal length of the F lens is also forced to decrease continuously. When the focal length is less than a certain value, due to a thread total reflection effect, transmission efficiency decreases as the focal length decreases. Conventionally, the efficiency of the F lens is difficult to exceed 60%-72%. Since the present invention intends to design the first liquid lens 21 and the incident lens 6 with a free-form surface, the thickness of the incident lens 6 with a free-form surface may be reduced, so the incidence lens 6 may be easily formed in injection molding process, or glass-pressing process may have a relatively high cost performance. Therefore, it will be no longer necessary to use the inefficient F lens. In fact, because of such expectation, the embodiment adopts the incident lens 6 with the free-form surface, which significantly improves illumination efficiency. Not only reflection loss caused by the air gap between the original optical parts is improved, but also light transmission efficiency of the incident lens 6 can be up to 98% (the incident surface 601 is coated with an AR film), which is 36-63% higher than using the F lens. At the same time, it is easier to improve illumination uniformity and to adjust solid angles of the light at light valve center and edges.

Single LCD projectors usually use the emergent lens 7 (working as a field lens), which usually adopts the aforementioned F lens. The F lens has a very large negative impact on image quality of the lenses. When there is a reflector between the LCD light valve 1 and a projecting lens, flare will be inevitable because of the total reflection generated by a gear ring on the F lens. When ambient light is dark, flare will inevitably affect the user experience. As mentioned earlier, the emergent lens 7 may be an aspherical lens, which has never been an option in low-price-based design for the single LCD projector with a relatively large light valve. As a result, a series of unsolved problems such as large field of view, short focus, low aperture number, high definition, and low aberration and distortion changes can be easily solved. The emergent lens 7 of the embodiment is a precision injection-molded aspheric lens having thin thickness and relatively uniform thickness distribution, in such a manner that discreteness of molding and thermal stability during working are completely free from engineering risks of mass production. Compared with the conventional F lens, optical efficiency is increased by 12%, and flare is eliminated. Theoretically, thermal expansion and contraction as well as refractive index drift of the second liquid lens 22 have a certain effect on lens imaging, but magnification of the main lens body is still performed by optical glass, so these adverse factors have little effect on the present invention, and have no effect on focusing performance of the lens.

It is precisely because the present invention has the first liquid lens 21 and the second liquid lens 22, the center thickness of the incident free-form surface lens during injection and the center thickness of the precision injection-molded aspheric emergent lens can be greatly reduced. The conventional F lens which brings various disadvantages is no longer necessary.

Optionally, the projector light valve module 100 further comprises: a first pressing piece 11, which presses and fixes the incident polarizing plate 2 to stabilize the incident polarizing plate 2.

Optionally, the projector light valve module 100 further comprises: a second pressing piece 17, which presses and fixes the emergent polarizing plate 4 to stabilize the emergent polarizing plate 4.

Optionally, the projector light valve module 100 further comprises: a third pressing piece 19, which presses and fixes the incident lens 6 to stabilize the incident lens 6.

Optionally, the projector light valve module 100 further comprises: a fourth pressing piece 20, which presses and fixes the emergent lens 7 to stabilize the emergent lens 7.

Optionally, the projector light valve module 100 further comprises: a fifth pressing piece 23, which presses and fixes the LCD light valve 1 to stabilize the LCD light valve 1.

Specifically, a basic implementation of the projector light valve with the liquid lens of the present invention is: the LCD light valve 1, the incident polarizing plate 2, and the emergent polarizing plate 4 are installed and fixed on the structural support 8, wherein the fifth pressure piece 23, the first pressing piece 11, and the second pressing piece 17 press the above three materials, respectively. The above three groups of six materials are fastened to the structural support 8 with screws 2401.

Black 704 silicone rubber is applied to assembling positions of the structural support 8 where the incident lens 6 and the emergent lens 7 are going to be installed, and then the incident lens 6 and the emergent lens 7 are installed. The incident lens 6 and the emergent lens 7 are pressed and fixed with the third pressing plate 19 and the fourth pressing plate 20, and then are fastened with screws 2413 to enhance sealing. The sealing is mainly realized by the above-mentioned 704 silicone rubber. The third pressing piece 19 and the fourth pressing piece 20 are used for mechanically strengthen and for dispersing stress of the lenses. As long as the incident lens 6 and the emergent lens 7 are integrated, with the structural support 8, the 704 silicone rubber can always maintain excellent elasticity due to weather resistance and light resistance, ensuring no liquid leakage during the service life of the projector.

Referring to FIG. 2, a connecting cable 103 of the LCD light valve 1 passes through a small hole 801 of the structural support 8. The black 704 silicon rubber is poured into a sealing cavity 808 of the structural support 8 to ensure that a position in which the connecting cable 103 of the LCD light valve 1 is located is sealed.

Through the above structural features and assembly, the sealed first cavity 3 and the sealed second cavity 5 are formed. It should be noted that: sealing is one of key factors for success application of all direct liquid cooling technologies. The position in which the connecting cable 103 of the LCD light valve 1 is located, the incident lens 6, the emergent lens 7, and the structural support 8 cooperate with each other for sealing. The present invention has no leakage under tests such as transportation, high-low temperature and high-low temperature cycle, dropping, and vibration.

Preferably, the 704 silicone rubber is used to seal each element. Compared with other common rubber rings, sealing rings and other sealing methods, the 704 silicone rubber has better reliability, durability, weather resistance and light resistance, and requires relatively low size accuracy of the raw materials comprising the LCD light valve, the polarizing plates, the lenses, the structural support, and the corresponding pressing pieces. Furthermore, the 704 silicone rubber is eco-friendly and non-corrosive.

Sealing of the above raw materials, which is between the incident lens 6 and the structural support 8, between the emergent lens 7 and the structural support 8, and between the connection cable 103 and the structural support 8, are all achieved by the 704 silicone rubber. In terms of sealing, compared with conventional technologies, the sealing has been significantly simplified, which creates conditions for being "simple and reliable".

Figure 6:
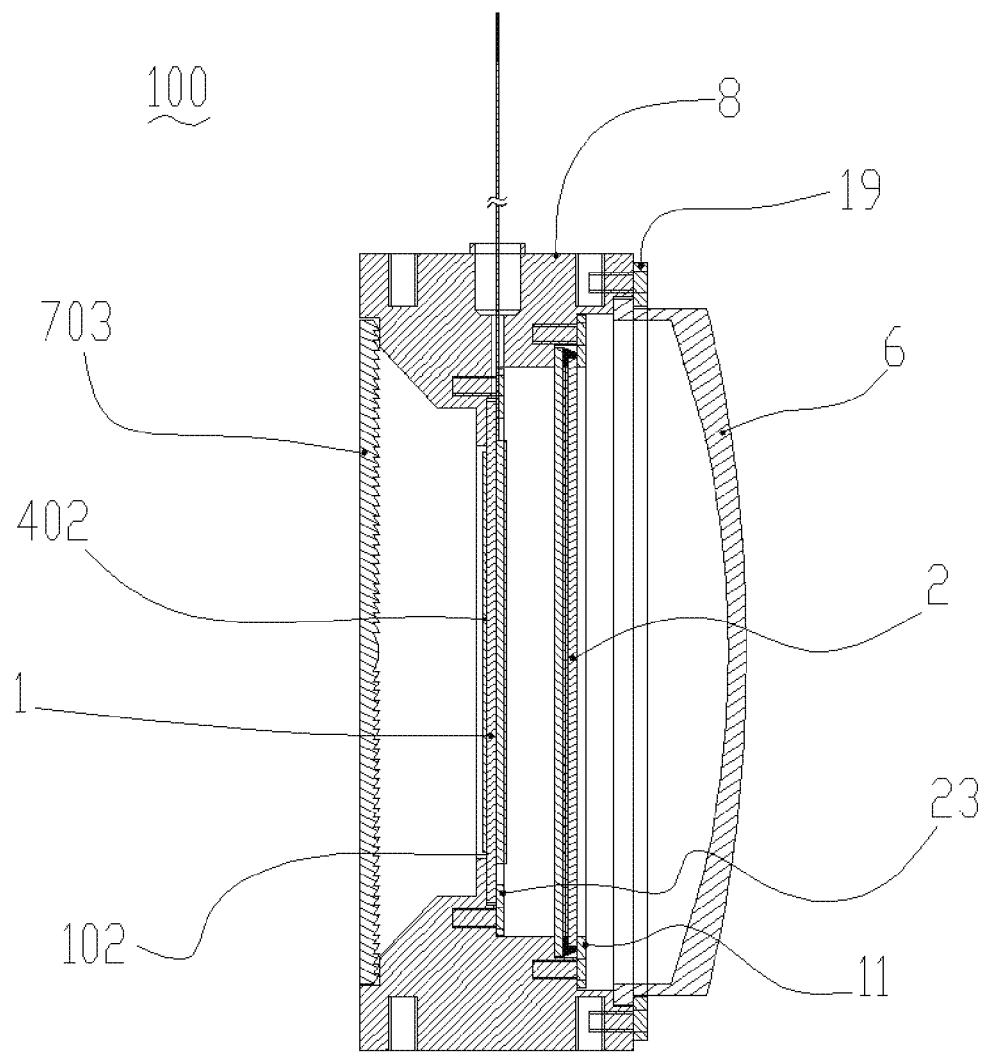
FIG. 6 is a cross-sectional view of the projector light valve module according to another embodiment provided by the present invention.

Referring to FIG. 6, according to another embodiment, when the second absorption polarizer 402 is attached to the emergent surface 102 of the LCD light valve 1 and no cooling liquid is injected into the second cavity 5, the LCD light valve 1 needs to be sealed liked the incident lens 6 as mentioned above. The original emergent polarizing plate 4 is omitted from the system, and the emergent lens 7 adopts an F lens 703 as a field lens. At this time, only the first liquid lens 21 is used to dissipate heat from the LCD light valve 1 and other materials, which is cost-effective and easy to manufacture.

Figure 7:
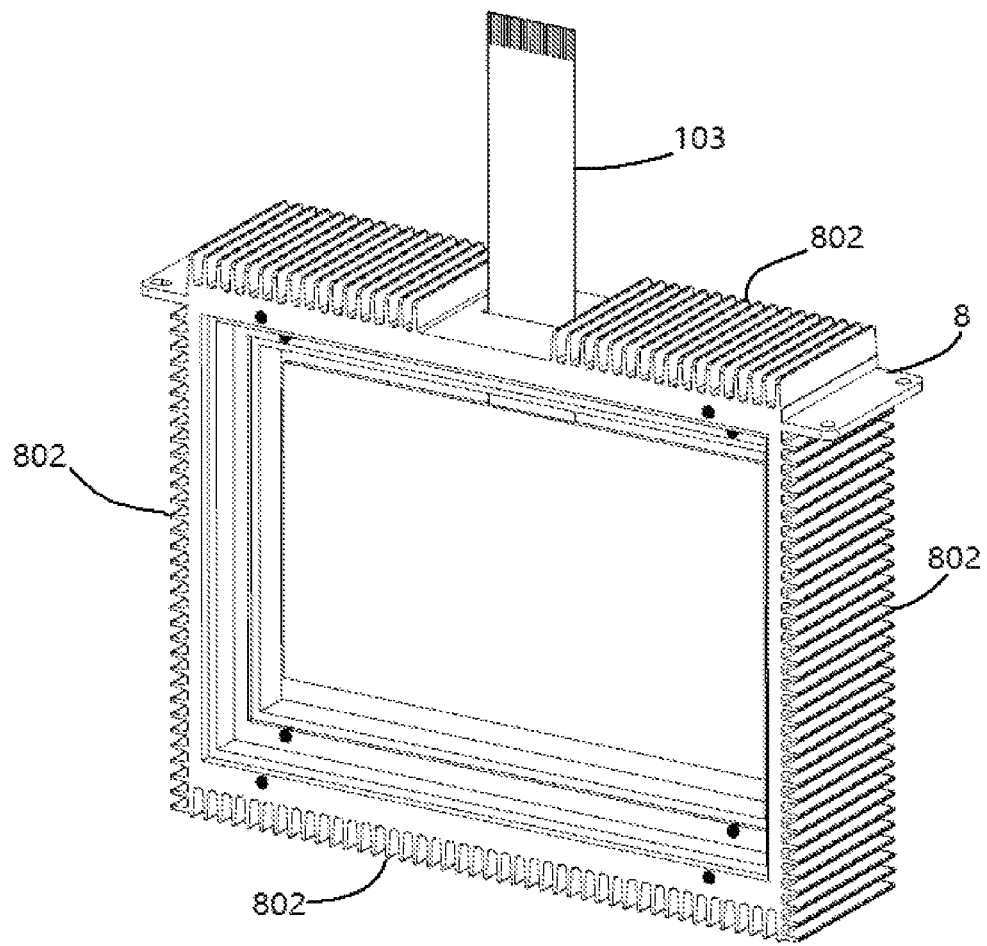
FIG. 7 is a perspective view of the projector light valve module according to another embodiment provided by the present invention.

Referring to FIG. 7, according to another embodiment, a plurality of fins 802 are provided on a peripheral wall of the structural support 8; wherein after the structural support 8 absorbs heat of the liquid lenses, the heat is further diffused into air by the fins 802; the structural support 8 is made of a thermally conductive material.

An airflow direction of the fins 802 should be considered in combination with an airflow direction in the air duct of projector.

Figure 8:
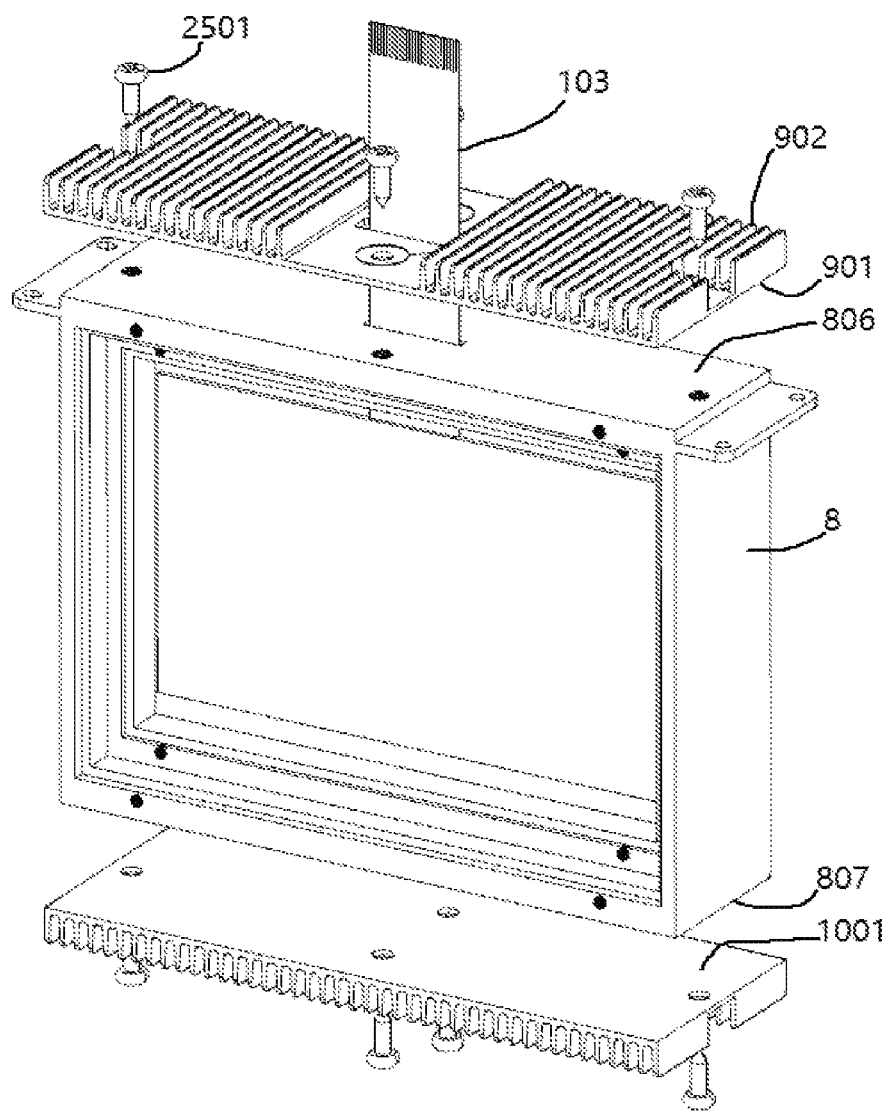
FIG. 8 is a perspective view of the projector light valve module according to another embodiment provided by the present invention.
Figure 9:
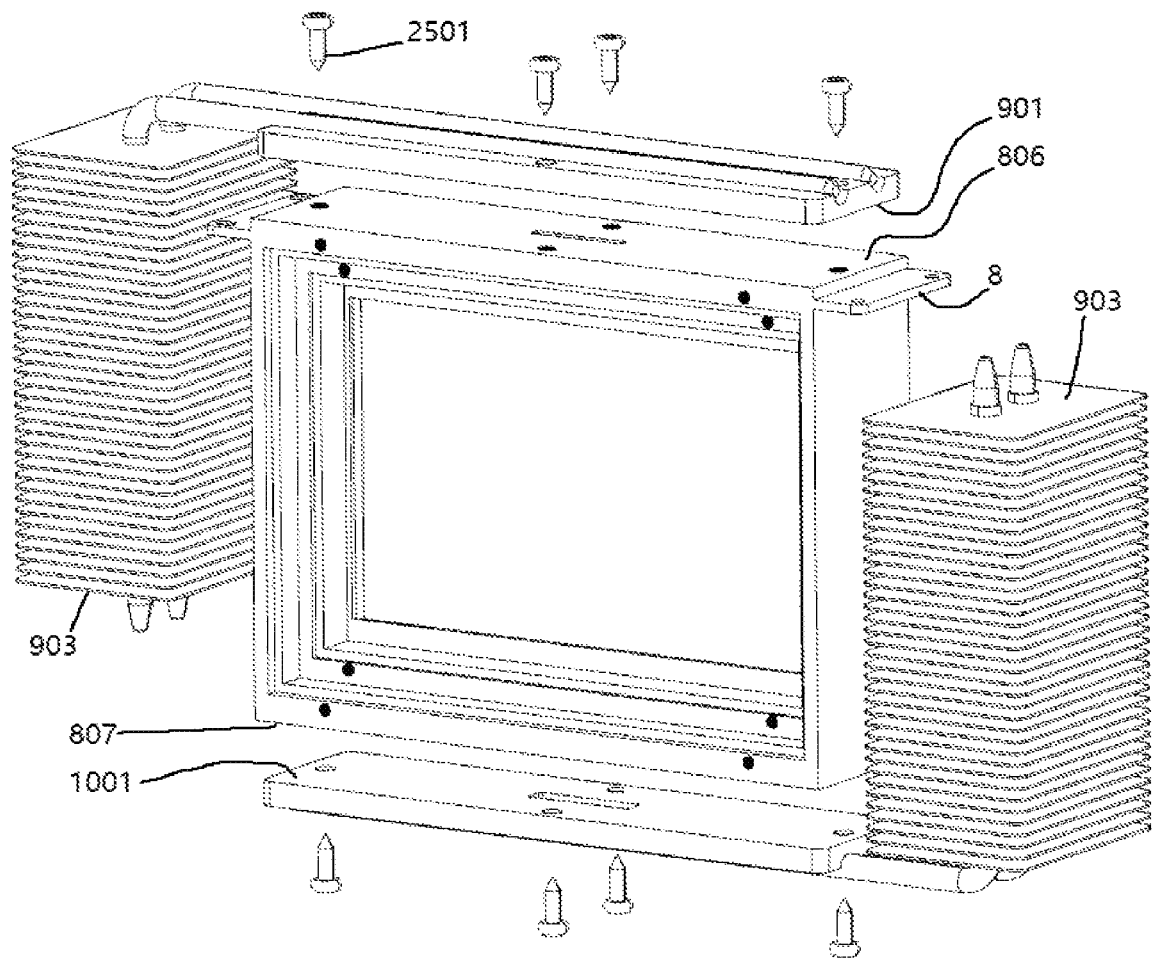
FIG. 9 is a perspective view of the projector light valve module according to another embodiment provided by the present invention.
Figure 10:
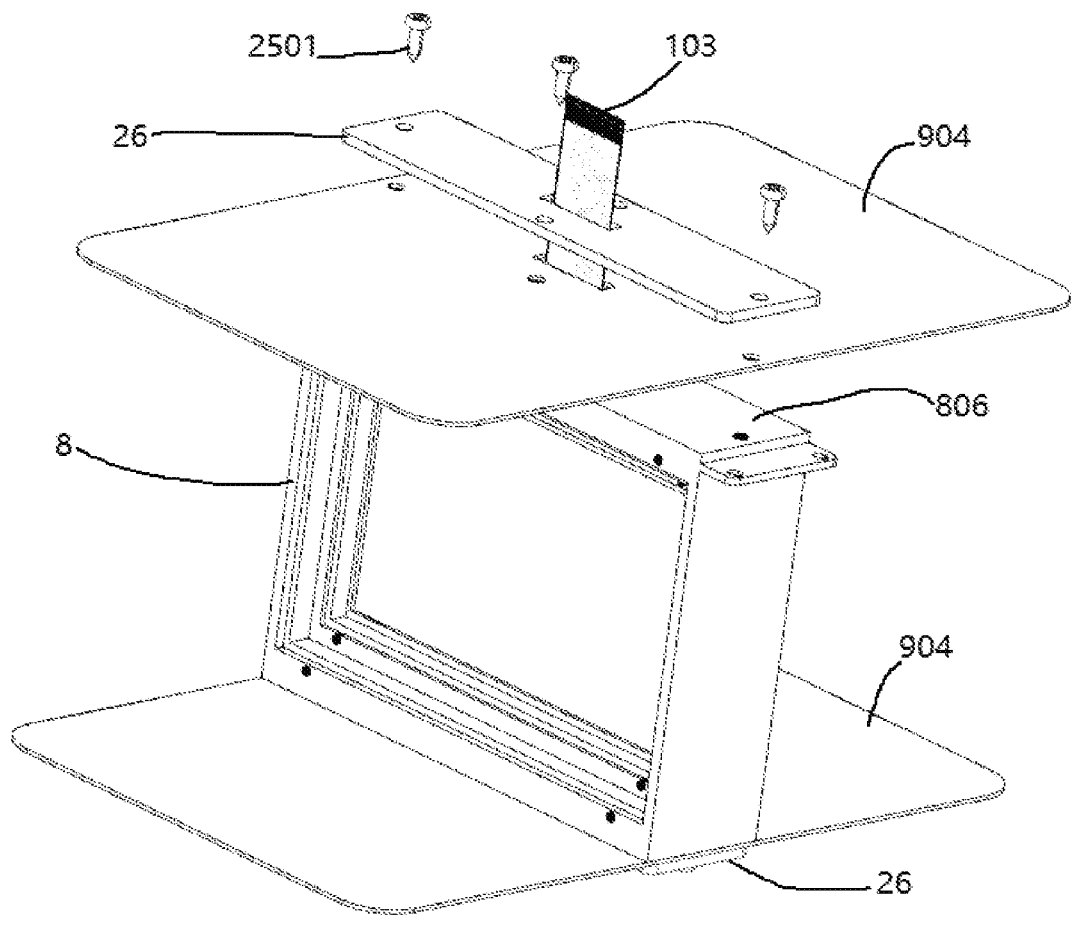
FIG. 10 is a perspective view of the projector light valve module according to another embodiment provided by the present invention.

Referring to FIGS. 8-10, according to another embodiment, the projector light valve module 100 further comprises: a thermal diffusion device 9 connected to a peripheral wall of the structural support 8, wherein the thermal diffusion device 9 comprises, but is not limited to, a profile heat sink 902, a pipe heat sink 903, and a thermally conductive diffusion sheet 904; wherein heat of the first liquid lenses sequentially passes through the structure support 8 and the thermal diffusion device 9, and is diffused into air; the structural support 8 is made of a thermally conductive material.

Specifically, the first liquid lens 21 and the second liquid lens 22 directly contact with a surface of a heat, and the transparent cooling liquid absorbs heat to generate natural convection movement. Heat dissipation surfaces 806, 807 are provided on upper and lower external surfaces of the structural support 8 respectively. The heat dissipation surfaces 806, 807 of the structural support 8 are assembled with heat absorption surfaces 901, 1001 of the external thermal diffusion device 9 through screws 2501.

The external thermal diffusion device can be the profile heat sink 902 as shown in FIG. 8, the pipe heat sink 903 as shown in FIG. 9, or the thermally conductive diffusion sheet 904 as shown in FIG. 10.

On the profile heat sink 902 or the pipe heat sink 903, the manufactured heat absorption surfaces 901, 1001 exchange heat with the heat dissipation surfaces 806, 807, and the two surfaces are required to be well installed and matched. During installation, materials such as thermal grease should be applied to eliminate the air gap between the heat dissipation surface 806 and the heat absorption surface 901, as and the air gap between the heat dissipation surface 807 and the heat absorption surface 1001, so that contact thermal resistance is smaller.

Referring to FIG. 10, the thermally conductive diffusion sheet 904 is preferably a new thermally conductive material such as a thermally conductive graphite sheet or a graphene sheet with a thermal conductivity coefficient of ≥1000 W/M·k in a horizontal (in-plane) direction. The thermally conductive diffusion plate 904 can also be a metal made of 1100 aluminum, 6063 aluminum, or copper. If some structural parts inside the projector are large-area metal parts and work near normal temperature, the above graphite sheet can also be used to connect the structural support 8 and these large-area metal structural parts for better thermal diffusion.

Referring to FIG. 10, strength and rigidity of the thermally conductive diffusion sheet 904 are insufficient, so it is necessary to use a sixth pressing sheet 26 to press it before locking with screws, so as to achieve even lower contact thermal resistance with the structural support 8.

Figure 11:
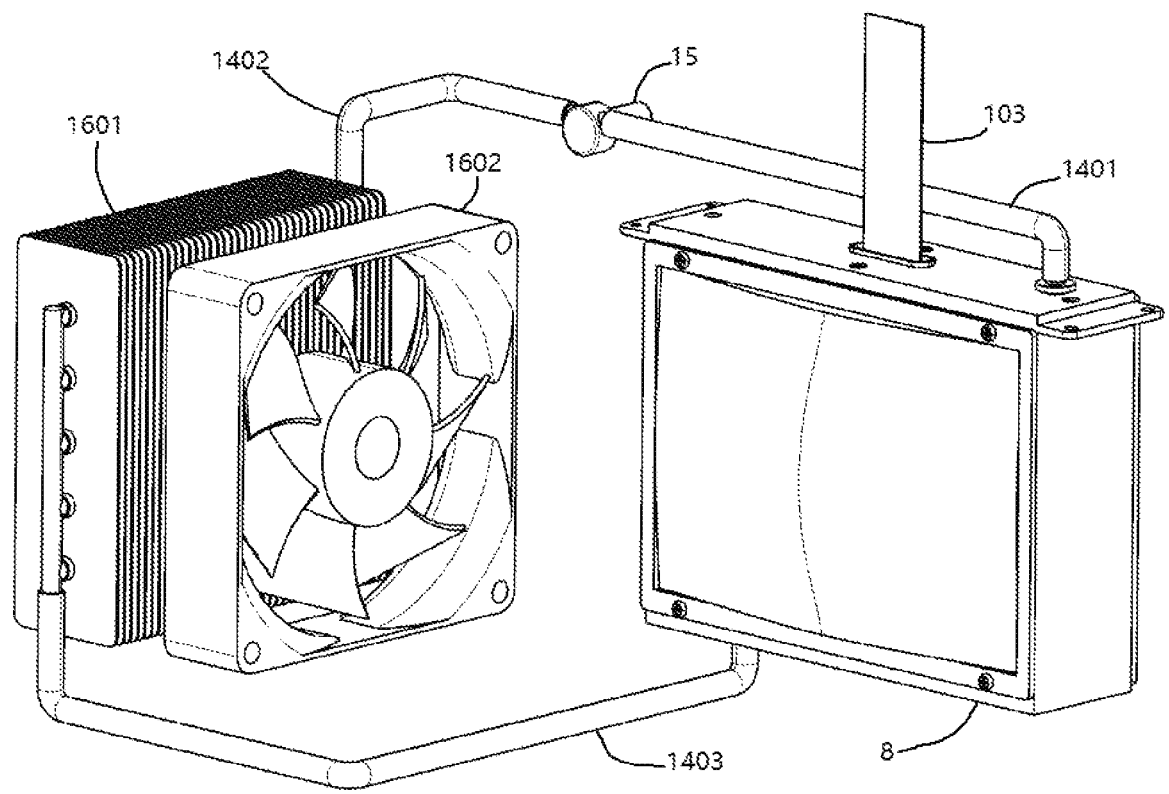
FIG. 11 is a perspective view of the projector light valve module according to another embodiment provided by the present invention.

Referring to FIG. 11, the projector light valve module 100 further comprises: an external piping system 14 and a circulation pump 15, wherein the external piping system 14 passes through the structural support 8 and is connected to the first cavity 3 and the second cavity 5; the external piping system 14 is connected to the circulation pump 15;

wherein the transparent cooling liquid in the first cavity 3 and the second cavity 5 is drawn out by the circulation pump 15 through the external piping system 14, which then passes through the external piping system 14 and flows back into the first cavity 3 and the second cavity 5, so as to increase a convection speed of the transparent cooling liquid.

Optionally, the projector light valve module 100 further comprises: a first pipe joint 12, a second pipe joint 1201, a first seal ring 13, and a second seal ring 1301. The external pipe system 14 comprises: a first pipe 1401 and a second pipe 1402. The first pipe joint 12 passes through the structural support 8 and communicates with the first cavity 3 and the second cavity 5; and the second pipe joint 1201 passes through the structural support 8 and communicates with the first cavity 3 and the second cavity 5. Opposite ends of the first pipe 1401 communicate with the first pipe joint 12 and the circulation pump 15, respectively. Opposite ends of the second pipe 1402 communicate with the circulation pump 15 and the second pipe joint 1201, respectively. The first seal ring 13 is placed between the first pipe joint 12 and the structural support 8, and the second seal ring 1301 is placed between the second pipe joint 1201 and the structural support 8.

The first pipe joint 12 is used to inject the transparent cooling liquid into the first cavity 3 and the second cavity 5 of the structural support 8. If the external pipe system 14 is not needed for enhanced cooling, installation holes of the first pipe joint 12 and the second pipe joint 1201 are directly plugged with "plugs" after injection. Channels, holes, or grooves, which are not shown in the drawings, should be formed in the first cavity 3 and second cavity 5, so as to achieve better temperature equalization and heat dissipation.

The circulation pump 15 is preferably a water pump that can work in both directions. When the projector is mounted on ceiling, the circulation pump 15 is reversed to keep pumping out the cooling liquid in a direction of natural convection.

The projector light valve module 100 further comprises: a radiator cooling system 16, wherein the external piping system 14 is connected to the radiator cooling system 16; wherein the circulation pump 15 draws the transparent cooling liquid in the first cavity 3 and the second cavity 5 into the radiator cooling system 16, and then draws cooled transparent cooling liquid in the water tank heat dissipation system 16 into the first cavity 3 and the second cavity 5.

Preferably, the radiator cooling system 16 comprises: a water tank 1601 and a first fan 1602. The external piping system 14 further comprises: a third pipe 1403. The opposite ends of the second piping 1402 communicate with the circulation pump 15 and the water tank 1601, respectively.

Opposite ends of the third pipe 1403 communicate with the water tank 1601 and the second pipe joint 1201, respectively.

The circulation pump 15 draws the transparent cooling liquid in the first cavity 3 and the second cavity 5 into the water tank 1601, and then draws the cooled transparent cooling liquid in the water tank 1601 into the first cavity 3 and the second cavity 5. The first fan 1602 assist the water tank 1601 in cooling.

Figure 12:
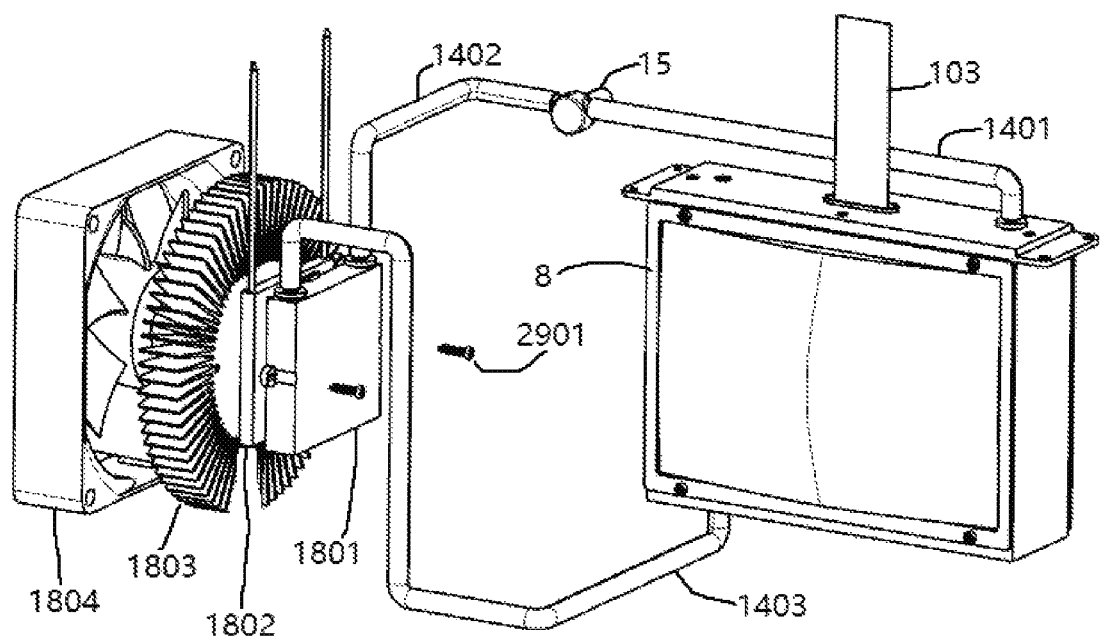
FIG. 12 is a perspective view of the projector light valve module according to another embodiment provided by the present invention.

Referring to FIG. 12, the projector light valve module 100 further comprises: a semiconductor refrigeration system 18, wherein the external piping system 14 is connected to the semiconductor refrigeration system 18; wherein the circulation pump 15 draws the transparent cooling liquid in the first cavity 3 and the second cavity 5 into the semiconductor refrigeration system 18, and then draws cooled transparent cooling liquid in the semiconductor refrigeration system 18 into the first cavity 3 and the second cavity 5.

Preferably, the semiconductor refrigeration system 18 comprises: a heat absorption box 1801, a semiconductor refrigeration sheet 1802, a radiator 1803, and a second fan 1804 connected in sequence. The external piping system 14 further comprises: a third pipe 1403. The opposite ends of the second piping 1402 communicate with the circulation pump 15 and the heat absorption box 1801, respectively. Opposite ends of the third pipe 1403 communicate with the heat absorption box 1801 and the second pipe joint 1201, respectively.

The circulation pump 15 draws the transparent cooling liquid in the first cavity 3 and the second cavity 5 into the heat absorption box 1801, and then draws the cooled transparent cooling liquid in the heat absorption box 1801 into the first cavity 3 and the second cavity 5. The semiconductor refrigeration sheet 1802, the radiator 1803, and the second fan 1804 are used to cool the heat absorption box 1801.

According to the embodiment, the semiconductor refrigeration system 18 is used to cool the transparent cooling liquid during circulating, thereby achieving a stronger heat dissipation effect for the LCD light valve 1, the incident polarizing plate 2, and the emergent polarizing plate 4. The semiconductor refrigeration system 18 comprises: the heat absorption box 1801, the semiconductor refrigeration sheet 1802, the radiator 1803, and the second fan 1804. The heat absorption box 1801, the semiconductor cooling sheet 1802, and the radiator 1803 are integrated into one module by fixing bolts 2901. When the heat absorption box 1801, the semiconductor refrigeration sheet 1802, and the radiator 1803 are combined, each contact surface needs to be filled with thermal grease or the like to reduce the contact thermal resistance and prevent hot and cold short circuits. The transparent cooling liquid pumped from the first cavity 3 and the second cavity 5 by the circulation pump 15 flows through and exchange heat with the heat absorption box 1801. The heat absorption box 1801 contacts with a cold end surface of the semiconductor refrigeration sheet 1802, and the semiconductor refrigeration sheet 1802 transfers heat to the radiator 1803. The second fan 1804 accelerates air flow at the radiator 1803 to quickly diffuse the heat into the air. With semiconductor refrigeration, the temperature of the cooling liquid can be precisely controlled, so that the plastic incident lens 6 and the plastic emergent lens 7, as well as the first liquid lens 21 and the second liquid lens 22, can always maintain precise optical parameters.

It should be noted that in the present invention, the terms "include", "comprise" or any other variants thereof are intended to be non-exclusive, so that a process, method, article or equipment that includes a series of elements may include other elements that are not explicitly listed, or include elements inherent to this process, method, article, or equipment.

The above are only preferred embodiments of the present invention. The above embodiments are only used to illustrate the technical solutions of the present invention, rather than limiting them. For those skilled in the art, the technical solutions described in the above embodiments can be modified, or some of the technical features can be equivalently replaced. These modifications and replacements shall fall within the protection scope of the appended claims of the present invention.

What is claimed is:

1. A projector light valve module with a liquid lens, comprising:
    a structural support (8) with a containing channel;
    an LCD (liquid-crystal display) light valve (1) assembled in the containing channel; and
    an incident lens (6) connected to a first end of the structural support (8), to cover an opening at a first end of the containing channel, wherein a first cavity (3) is sealed and is formed by the incident lens (6), the structural support (8) and the LCD light valve (1), and the first cavity (3) is filled with transparent cooling liquid; a first liquid lens (21) is formed by an emergent surface (602) of the incident lens (6), the transparent cooling liquid in the first cavity (3), and an incident surface (101) of the LCD light valve (1);
    wherein, when light from a projector illumination system passes through the incident lens (6), the first liquid lens (21), and the LCD light valve (1) in sequence, the incident lens (6) and the first liquid lens (21) are integrated without air gap to refract and shape the light, and the first liquid lens (21) cools the LCD light valve (1) and the incident lens (6).

2. The projector light valve module, as recited in claim 1, further comprising: an emergent lens (7), wherein the emergent lens (7) is connected to a second end of the structural support (8), to cover an opening at a second end of the containing channel; a second cavity (5) is sealed and is formed by the LCD light valve (1), the emergent lens (7) and the structural support (8), and the second cavity (5) is filled with transparent cooling liquid;
    a second liquid lens (22) is formed by an emergent surface (102) of the LCD light valve (1), the transparent cooling liquid in the second cavity (5), and an incident surface (701) of the emergent lens (7); the second liquid lens (22) and the emergent lens (7) are integrated without air gap to provide a field lens function;
    wherein, when the light from the projector illumination system passes through the incident lens (6), the first liquid lens (21), the LCD light valve (1), the second liquid lens (22), and the emergent lens (7) in sequence, the first liquid lens (21) and the second liquid lens (22) are involved in refracting and shaping the light, and meanwhile cool the LCD light valve (1), the incident lens (6) and the emergent lens (7).

3. The projector light valve module, as recited in claim 1, further comprising:
    an incident polarizing plate (2) assembled in the first cavity (3), wherein the incident polarizing plate (2) comprises two first glass substrates (201, 204) which are opposed and sealed, a reflective polarizer (202), and a first absorption polarizer (203); the reflective polarizer (202) and the first absorption polarizer (203) are arranged between the two first glass substrates (201, 204); an incident surface of the reflective polarizer (202) faces the incident lens (6).

4. The projector light valve module, as recited in claim 2, further comprising:

an emergent polarizing plate (4) assembled in the second cavity (5), wherein the emergent polarizing plate (4) comprises two second glass substrates (401, 403) which are opposed and sealed, and a second absorption polarizer (402); the second absorption polarizer (402) is arranged between the two second glass substrates (401, 403).

5. The projector light valve module, as recited in claim 4, further comprising:

a first pressing piece (11), which presses and fixes the incident polarizing plate (2) to stabilize the incident polarizing plate (2); and/or a second pressing piece (17), which presses and fixes the emergent polarizing plate (4) to stabilize the emergent polarizing plate (4).

6. The projector light valve module, as recited in claim 2, further comprising:

a third pressing piece (19), which presses and fixes the incident lens (6) to stabilize the incident lens (6); and/or a fourth pressing piece (20), which presses and fixes the emergent lens (7) to stabilize the emergent lens (7); and/or a fifth pressing piece (23), which presses and fixes the LCD light valve (1) to stabilize the LCD light valve (1).

7. The projector light valve module, as recited in claim 2, wherein a plurality of fins (802) are provided on a peripheral wall of the structural support (8); wherein after the structural support (8) absorbs heat of the first liquid lens (21) and the second liquid lens (22), the heat is further diffused into air by the fins (802); the structural support (8) is made of a thermally conductive material.

8. The projector light valve module, as recited in claim 2, further comprising:

a thermal diffusion device (9) connected to a peripheral wall of the structural support (8), wherein the thermal diffusion device (9) comprises a profile heat sink (902), a pipe heat sink (903), and a thermally conductive diffusion sheet (904); wherein heat of the first liquid lens (21) and the second liquid lens (22) sequentially passes through the structure support (8) and the thermal diffusion device (9), and is diffused into air; the structural support (8) is made of a thermally conductive material.

9. The projector light valve module, as recited in claim 2, further comprising:

an external piping system (14) and a circulation pump (15), wherein the external piping system (14) passes through the structural support (8) and is connected to the first cavity (3) and the second cavity (5); the external piping system (14) is connected to the circulation pump (15);

wherein the transparent cooling liquid in the first cavity (3) and the second cavity (5) is drawn out by the circulation pump (15) through the external piping system (14), which then passes through the external piping system (14) and flows back into the first cavity (3) and the second cavity (5), so as to increase a convection speed of the transparent cooling liquid in the first cavity (3) and the second cavity (5).

10. The projector light valve module, as recited in claim 9, further comprising:

a radiator cooling system (16) or a semiconductor refrigeration system (18), wherein the external piping system (14) is connected to the radiator cooling system (16) or the semiconductor refrigeration system (18);

wherein the circulation pump (15) draws the transparent cooling liquid in the first cavity (3) and the second cavity (5) into the radiator cooling system (16) or the semiconductor refrigeration system (18), and then draws cooled transparent cooling liquid in the water tank heat dissipation system (16) or the semiconductor refrigeration system (18) into the first cavity (3) and the second cavity (5).

\* \* \* \* \*